United States Patent
Biela et al.

(10) Patent No.: US 8,723,589 B2
(45) Date of Patent: May 13, 2014

(54) SWITCHING DEVICE WITH A CASCODE CIRCUIT

(75) Inventors: Jürgen Biela, Zürich (CH); Johann W. Kolar, Zürich (CH); Daniel Aggeler, Zürich (CH)

(73) Assignee: ETH Zurich, Zurich (CH)

( * ) Notice: Subject to any disclaimer, the term of this patent is extended or adjusted under 35 U.S.C. 154(b) by 0 days.

(21) Appl. No.: 13/254,283

(22) PCT Filed: Mar. 22, 2010

(86) PCT No.: PCT/CH2010/000078
§ 371 (c)(1),
(2), (4) Date: Jan. 13, 2012

(87) PCT Pub. No.: WO2010/108292
PCT Pub. Date: Sep. 30, 2010

(65) Prior Publication Data
US 2012/0105131 A1   May 3, 2012

(30) Foreign Application Priority Data

Mar. 27, 2009 (CH) ........................ 0484/09

(51) Int. Cl.
*H03K 17/687* (2006.01)
(52) U.S. Cl.
USPC .......................................... 327/430; 327/436
(58) Field of Classification Search
USPC ......... 327/430, 434, 436, 379, 381, 389, 390, 327/503, 505; 361/88, 89, 91.1, 91.5, 93.1, 361/93.7
See application file for complete search history.

(56) References Cited

U.S. PATENT DOCUMENTS

| | | | |
|---|---|---|---|
| 4,677,324 A | 6/1987 | Ronan | |
| 6,157,049 A | 12/2000 | Mitlehner et al. | |

(Continued)

FOREIGN PATENT DOCUMENTS

| | | |
|---|---|---|
| DE | 196 10 135 C1 | 6/1997 |
| DE | 199 02 520 A1 | 8/2000 |

(Continued)

OTHER PUBLICATIONS

International Search Report for international application No. PCT/CH2010/000078 mailed Sep. 20, 2010.

(Continued)

*Primary Examiner* — Lincoln Donovan
*Assistant Examiner* — Jung H Kim
(74) *Attorney, Agent, or Firm* — Oppedahl Patent Law Firm LLC

(57) ABSTRACT

A switching device for switching a current between a first terminal (1) and a second terminal (2) comprises a cascode circuit having a series connection of a first semiconductor switch (M) and a second semiconductor switch (J), wherein the two semiconductor switches (M, J) are connected to each other by a common point (13), and the first semiconductor switch (M) is controlled by way of a first control input in accordance with a voltage between the first control input and the first terminal (1), and the second semiconductor switch (J) is controlled by way of a second control input (4) in accordance with a voltage between the second control input (4) and the common point (13). To this end, a control circuit having a specifiable capacitance (C) is connected between the second terminal (2) and at least one of the control input.

18 Claims, 5 Drawing Sheets

(56) References Cited

U.S. PATENT DOCUMENTS

| | | | |
|---|---|---|---|
| 7,746,156 B1 * | 6/2010 | Massie et al. | 327/427 |
| 2002/0153938 A1 * | 10/2002 | Baudelot et al. | 327/430 |
| 2004/0027753 A1 * | 2/2004 | Friedrichs et al. | 361/90 |
| 2004/0047098 A1 * | 3/2004 | Friedrichs et al. | 361/93.1 |
| 2010/0045247 A1 | 2/2010 | Blanken | |
| 2011/0291738 A1 * | 12/2011 | Biela et al. | 327/430 |

FOREIGN PATENT DOCUMENTS

| | | |
|---|---|---|
| DE | 101 35 835 C1 | 8/2002 |
| DE | 103 50 170 B3 | 1/2005 |
| JP | 63266003 | 11/1988 |
| JP | 64073731 | 3/1989 |
| JP | 2001251846 A | 9/2001 |
| JP | 2006158185 A | 6/2006 |
| JP | 2006351691 A | 12/2006 |
| JP | 2007166159 A | 6/2007 |
| JP | 2008042317 A | 2/2008 |
| JP | 2008537467 A | 9/2008 |
| WO | 02/49215 A1 | 6/2002 |
| WO | 02/056472 A1 | 7/2002 |

OTHER PUBLICATIONS

Written Opinion for international application No. PCT/CH2010/000078.

* cited by examiner

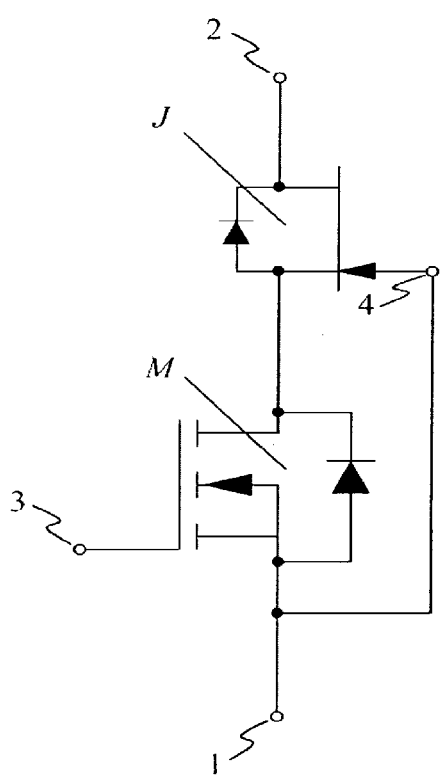 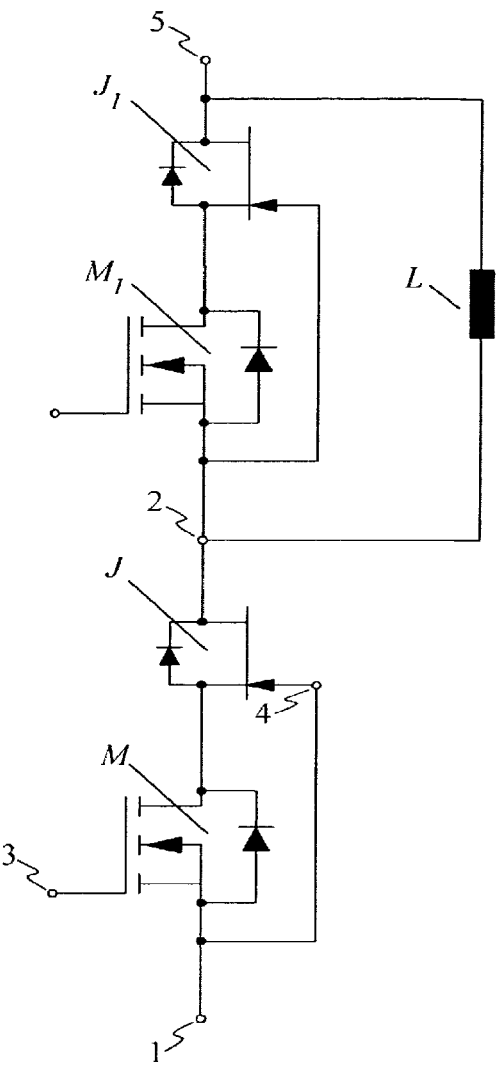
Fig. 1
PRIOR ART
Fig. 2
PRIOR ART

SWITCHING DEVICE WITH A CASCODE CIRCUIT

The invention relates to the field of electronic switching technology and in particular to a switching device with a cascode circuit, according to the preamble of patent claim 1.

STATE OF THE ART

Electronic devices for the rapid switching of electrical currents at high operating voltages, in particular with low conduction losses, may be realised according to DE 196 10 135 C1 or U.S. Pat. No. 6,157,049. Thereby, the electronic device is based on a special connection of a MOSFET M and a JFET J (junction field effect transistor) illustrated by FIG. 1. The two switches are arranged between a first connection 1 and a second connection 2 and are controlled by a control terminal 3 of the MOSFET M.

By way of example, the description of the state of the art and subsequently also according to the invention is shown for a half-bridge topology with an inductive load, as is shown in FIG. 2. The half-bridge with power-electronic switches M, J, $M_1$, $J_1$ and with an inductive load L connected between the third terminal 5 and the second terminal 2 shows a typical arrangement as occurs in many power-electronic systems. A lower cascode circuit between the first terminal 1 and the second terminal 2 is formed by a lower MOSFET M and a lower JFET J. An upper cascode circuit between the second terminal 2 and the third terminal 5 is formed by an upper MOSFET $M_1$ and a JFET $J_1$. The third terminal 5 thereby for example lies at an intermediate circuit voltage, the first terminal 1 at an opposite intermediate circuit voltage or at a star-point of a multi-phase system. Thereby, instead of the upper cascode circuit, one may also use a diode with the cathode terminal at the third terminal 5.

An impressed (injected, load-independent) current in the inductance L flows from the second terminal 2 to the first terminal 1 when the lower cascode circuit is switched on, thus is conductive. On switching off the lower MOSFET M, a negative pinch-off voltage is applied to the lower JFET J arranged in series, and this pinch-off voltage blocks the lower JEFT J. Thereby, the current commutes from the lower cascode circuit to the upper cascode circuit. The current then flows through the inductance L and from the second terminal 2 through the channel/body diodes of the upper MOSFET $M_1$ and the upper JEFT $J_1$ to the third terminal 5. The channel/body diodes in the figures are drawn in each case in a manner which is anti-parallel to the respective switch. Here they therefore act as anti-parallel freewheeling diode.

The time for the charge transport (charge transfer) or the building-up of the blocking voltage for the switches is dependent on the current, due to the parasitic switch capacitances as a result of the construction of the switches. The greater the current through the inductance L, the quicker does the commutation take place and thus the quicker does the blocking voltage build up over the respective switch. This has the result that very high values of the voltage change (du/dt) may arise, which may vary greatly influence the EMC (electromagnetic compatibility) behaviour.

The extremely high du/dt when switching on this special connection of MOSFET and JFET which may be achieved if the lower cascode circuit commutes the current away from the upper freewheeling diodes is not dependent on the load current. The resulting, very steep voltage flanks when switching on, may however also greatly influence the EMC.

Different applications therefore require a control of the switching speed (on switching-on as well as on switching-off) and thus a method of being able to control the voltage flanks independently of the load current, in order with this, to reduce or to eliminate the coupled-in disturbances. For individual discrete transistors thereby, in known methods, amongst other things, the gate driver circuit is modified and a significant control of the commutation is already obtained by way of this, when switching on as well as when switching off the transistors.

A further known possibility, in order—with a single MOSFET—to influence the du/dt control behaviour, is to enlarge the associated gate-drain capacitance and thus to extend the Miller effect limiting the gate current. The negative feedback from the drain to the gate is amplified, and in particular the switching-on duration as well as also the switching-off duration is extended, due to the additional gate-drain capacitance. Accordingly, the du/dt values become smaller.

In the special connections of MOSFETS M and JFETS J, one may however not use known methods such as the modification of the gate driver circuit, since this only changes the behaviour of the MOSFET and not the behaviour of the JFET, to which the high operating voltage is applied.

DESCRIPTION OF THE INVENTION

It is therefore the object of the invention to provide a switching device and a method for the control of the du/dt behaviour of the initially mentioned type, which alleviates the disadvantages mentioned above. In particular, one object is to limit the speed of the voltage change at the switches or to set it at a defined level, without important other characteristics of the switching device being negatively influenced.

This object is achieved by a switching device with a series connection of MOSFETs and JFETs, with the features of patent claim 1.

The switching device for switching a current between a first terminal and a second terminal thus comprises a cascode circuit with a series connection of a first semiconductor switch and a second semiconductor switch, wherein the two semiconductor switches are connected to one another via a common point, and the first semiconductor switch is activated by way of a first control input in accordance with a voltage between the first control input and the first terminal, and the second semiconductor is activated by way of a second control input in accordance with a voltage between the second control input and the common point.

Thereby, a control circuit with a capacitance of a settable size is connected between the second terminal and at least one of the control inputs.

The capacitance thus increases the drain-gate capacitance (parallel to the internal drain-gate switch capacitance), wherein preferably a damping resistance thereby helps to damp occurring oscillations and simultaneously to limit the charging/discharging current for the capacitance. Generally therefore, the control switch is preferably an RC-element.

There greater the capacitance is selected, the larger is the negative feedback to the control input and the greater is the Miller effect which leads to the switch-on speed or the switch-off speed being slowed and thus the steepness of voltage changes being reduced to low values.

In a preferred embodiment of the invention, the first semiconductor switch is an IGFET, in particular a MOSFET, and the second semiconductor switch is a JFET. For the sake of simplicity, hereinafter one only speaks of a MOSFET or of a JEFT, wherein what is said also generally applies also to first and second semiconductor switches cooperating in a cascode circuit. With regard to the common term "MOSFET", in this application, this is also to be understood in each case as semiconductor components under the general description MISFET (metal-insulator semiconductor FET) or very generally IGFET (insulated-gate FET).

In a further preferred embodiment of the invention, a resistance arrangement is connected between the second control input and the first terminal. This serves for slowing a charging procedure at an inner capacitance between the control input and the terminal of the second semiconductor switch which is connected to the second terminal.

The resistance arrangement, for example a single additional resistance, represents a switch-on resistance for the DEFT. In particular, this, with the gate source capacitance of the DEFT, forms a further RC-element and with this slows the charging and discharging of the gate-source capacitance of the JFET to the pinch-off voltage and to the switch-on voltage of 0 Volt respectively.

Furthermore, the charging or discharging current of the capacitance of the control circuit is limited by way of the additional resistance, wherein one is also to take the damping resistance into account. Due to the charging and discharging current of the capacitance, a voltage briefly prevails over the additional resistance and increases or reduces the potential of a fourth terminal (or second control input) to the gate terminal of the JFET and as a result counteracts the switching-off or switching-on of the JFET respectively.

In a further embodiment of the invention, an additional series resistance is connected in front of the gate terminal of the JFET, thus between the gate terminal and the fourth terminal, in order thus to ensure an as optimal as possible activation of the JFET and in particular to individually determine the switching speed.

In another preferred embodiment of the invention, the switching characteristics when switching on and switching off are set independently of one another and thus different du/dt values or synchronised du/dt values are achieved by way of a further network being connected between the fourth and the first terminal. This network with diodes and different damping resistances may be designed and optimised separately for the switching-on or switching-off of the JFETs.

Basically, the RC-element as a control circuit between the fourth and the second terminal may be a parallel connection, or a parallel connection with adaptable damping resistances for the switching-on or switching-off, or an individually adaptable parallel connection, in which damping resistances as well as the capacitances may be adapted to the switching-on behaviour or the switching-off behaviour.

In a further preferred embodiment of the invention, a capacitance is incorporated between the third terminal (or the first control input) and the second terminal. Thereby, the first control input is equal to the gate terminal of the MOSFET. By way of this, the negative feedback of the second terminal acts on the gate terminal of the MOSFET, and as a result of the additionally required charge carriers which may not be provided by the gate drive circuit, the Miller effect is increased and the Miller plateau is extended and thus the switching speed is reduced when switching-on as well as when switching-off.

The capacitance between the second and third terminal may basically also be connected in front of a (non-inverting) amplifier circuit and then the amplifier circuit may be connected to the third terminal.

Further preferred embodiments are to be deduced from the dependent patent claims.

BRIEF DESCRIPTION OF THE DRAWINGS

The subject matter of the invention is explained in more detail by way of preferred embodiment examples which are represented in the accompanying drawing. In each case are shown schematically in:

FIG. 1 a series connection of a MOSFET and of a JFET, according to the state of the art;

FIG. 2 an exemplary application of such a circuit according to the state of the art;

Basically, in the figures, the same parts are provided with the same reference numerals

WAYS OF CARRYING OUT THE INVENTION

Figure 3:
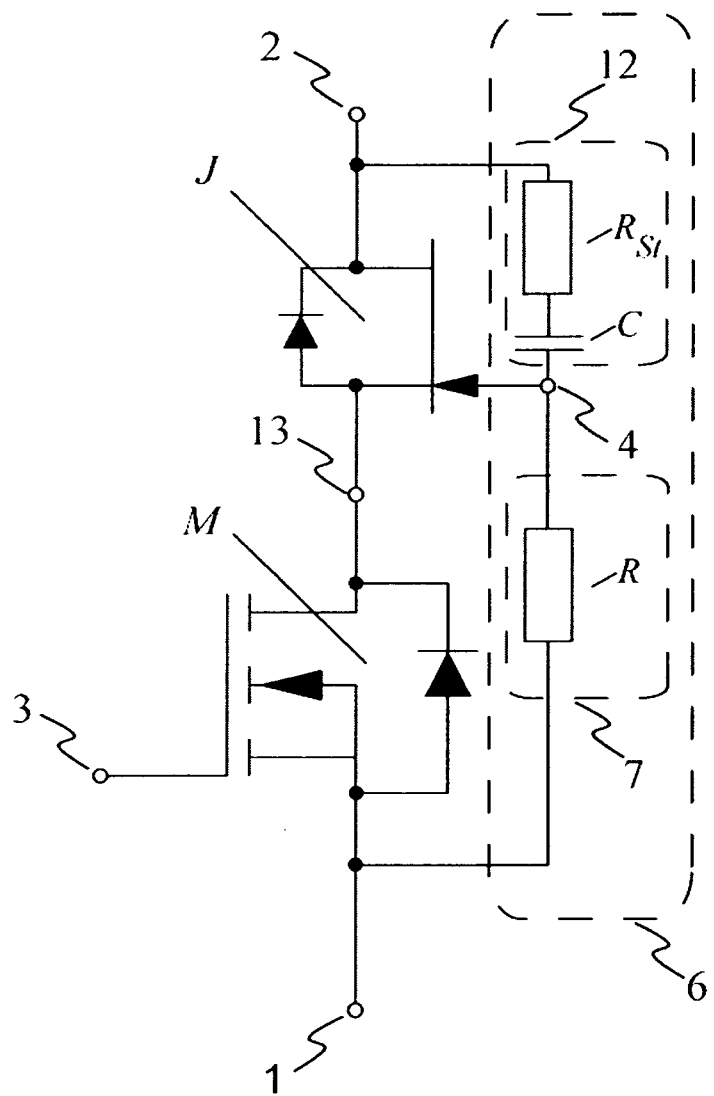
FIG. 3 a first embodiment of the invention.

FIG. 3 shows a first embodiment of the invention: An individual switching device, typically as a part of a more extensive switch arrangement, for example in an inverter, comprises a cascode circuit with a first and with a second semiconductor switch. Here and in the subsequent examples, in each case one speaks of JFET and MOSFET switches, and n-channel semiconductor elements are drawn in the figures. The invention however, in an analogous manner, may also be realised with p-channel elements, with a reverse polarity and also for bipolar transistors.

The switching device of FIG. 3 as well as also FIGS. 4-7 may be multiplied in a suitable manner and be applied in one or more bridge branches according to the structure of FIG. 2.

The switching device thus on the one hand comprises two semiconductor switches, in the shown embodiments in each case a JFET J and a MOSFET M (or IGFET) in a cascode circuit. Thus the MOSFET M as a first semiconductor switch may be connected between a first terminal 1 and a common terminal 13, and the JFET J as a second semiconductor switch may be connected between the common terminal 13 and the second terminal 2. The MOSFET M is activated via its gate terminal 3 as a first control input 3. The JFET J is activated via its gate terminal. In a cascode circuit according to the state of the art, the gate terminal of the JFET J would be connected directly to the first terminal, and the control of the JFET J results according to the gate-source voltage.

In one embodiment of the invention, a control circuit 12 with a capacitance of a presettable size is now connected between a second control input 4 and the second terminal 2. This second control input 4 is either connected directly to the gate terminal of the JFET J, thus seen electrically, identical to the gate terminal (FIG. 3), or is connected via a presettable series resistance $R_g$ to the gate terminal of the JFET J (FIG. 4).

Figure 4:
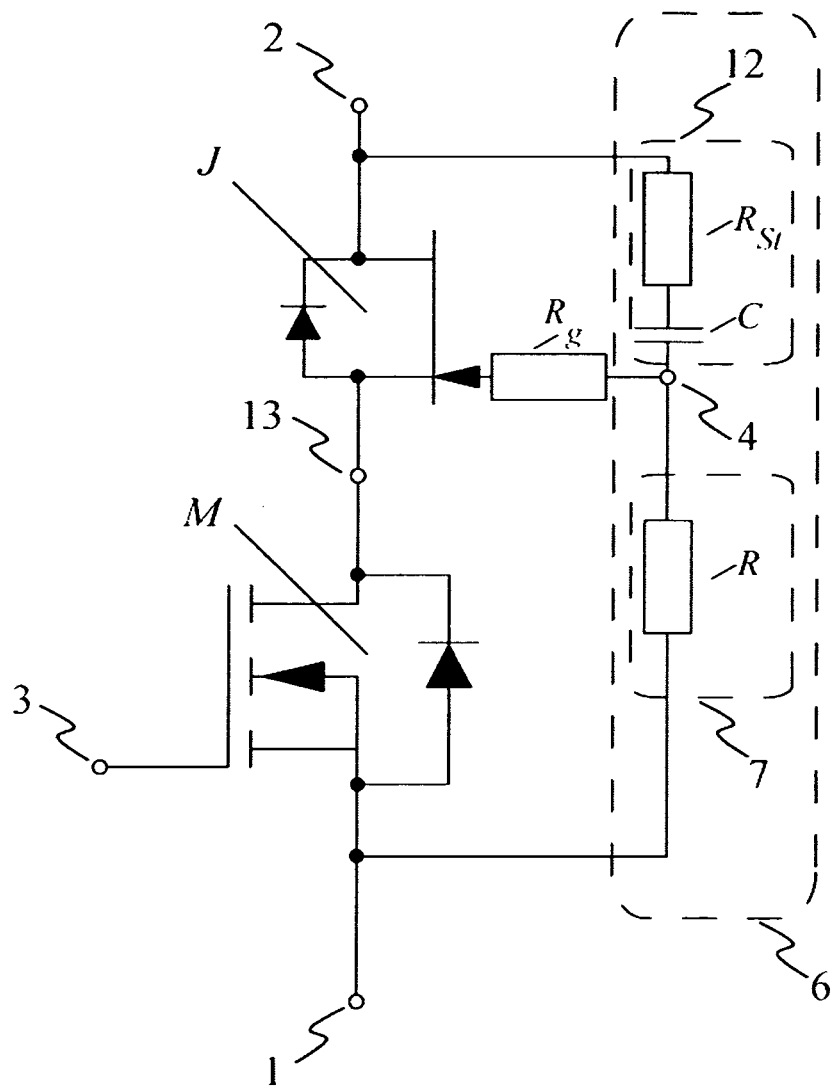
FIG. 4 a second embodiment of the invention.

The control circuit 12 in a first variant according to FIG. 3 and FIG. 4 comprises a series connection of the capacitance C to a damping resistance $R_{St}$. Additionally to the control circuit, a resistance arrangement 7 may be arranged between the second control input 4 and the first terminal 4. The resistance arrangement 7 and the control circuit 12 together form a circuitry network 6 for the second control input 4. The circuitry network 6 permits the controlled influencing of the switching times of the cascode circuit in the following manner:

The capacitance C increases the Miller capacitance of the JFET J or of the complete cascode circuit.

The damping resistance $R_{St}$ prevents oscillations which may occur due to the capacitance C.

The resistance arrangement 7, for example with the optional additional resistance R, slows down a charging procedure at an inner capacitance between the gate and the drain of the JFET J.

The optional series resistance $R_g$ effects a delay in the blocking reaction or switch-on reaction of the JFET J, and, together with the additional resistance R, additionally slows down the charging or discharging of an internal capacitance between the gate and the source of the JFET J.

On account of the relative small blocking voltage, which prevails over the first semiconductor switch, the influencing of the switching times for the cascode circuit due to the series resistance $R_g$ is relatively small compared to the influence of the additional resistance R. Despite this, it may be advantageous to select the series resistance $R_g$ in a targeted manner for setting the switching times. One must however take care that the total resistance, resulting from the series connection of the additional resistance R and of the series resistance $R_g$, is not selected too large, in order to limit the thermal loading between the source and the gate of the JFET (in avalanche operation of the parasitic diode between the source and the gate). For this reason, the series resistance $R_g$ is to be selected relatively small (lower Ohm region) compared to the additional resistance R, independently of the switching speed and operating voltage.

Basically, the switching speed may be influenced via the capacitance C of the control circuit as well as via the additional resistance R. A combination of both values is to be selected taking into account for example geometric constraints and the above-described thermal limitation of the size of the permitted additional resistance R. The remaining parameters are secondary and are dimensioned for current limitation or for discharge at the capacitances.

One example of a selection of the control circuits and the resistance arrangement for achieving a desired switching speed of a cascode circuit is hereinafter given according to FIG. 3: with an intermediate circuit voltage of 400 V and a commutation current of 4 A, the influencing of the du/dt behaviour is as follows: With parameters such as C=100 pF and $R_{St}$=100Ω for the control circuit 12 and a resistance R=47Ω for the resistance arrangement 7, a speed of the voltage changes du/dt of 3.8 kV/μs results instead of 32 KV/μs without circuitry network.

Figure 5:
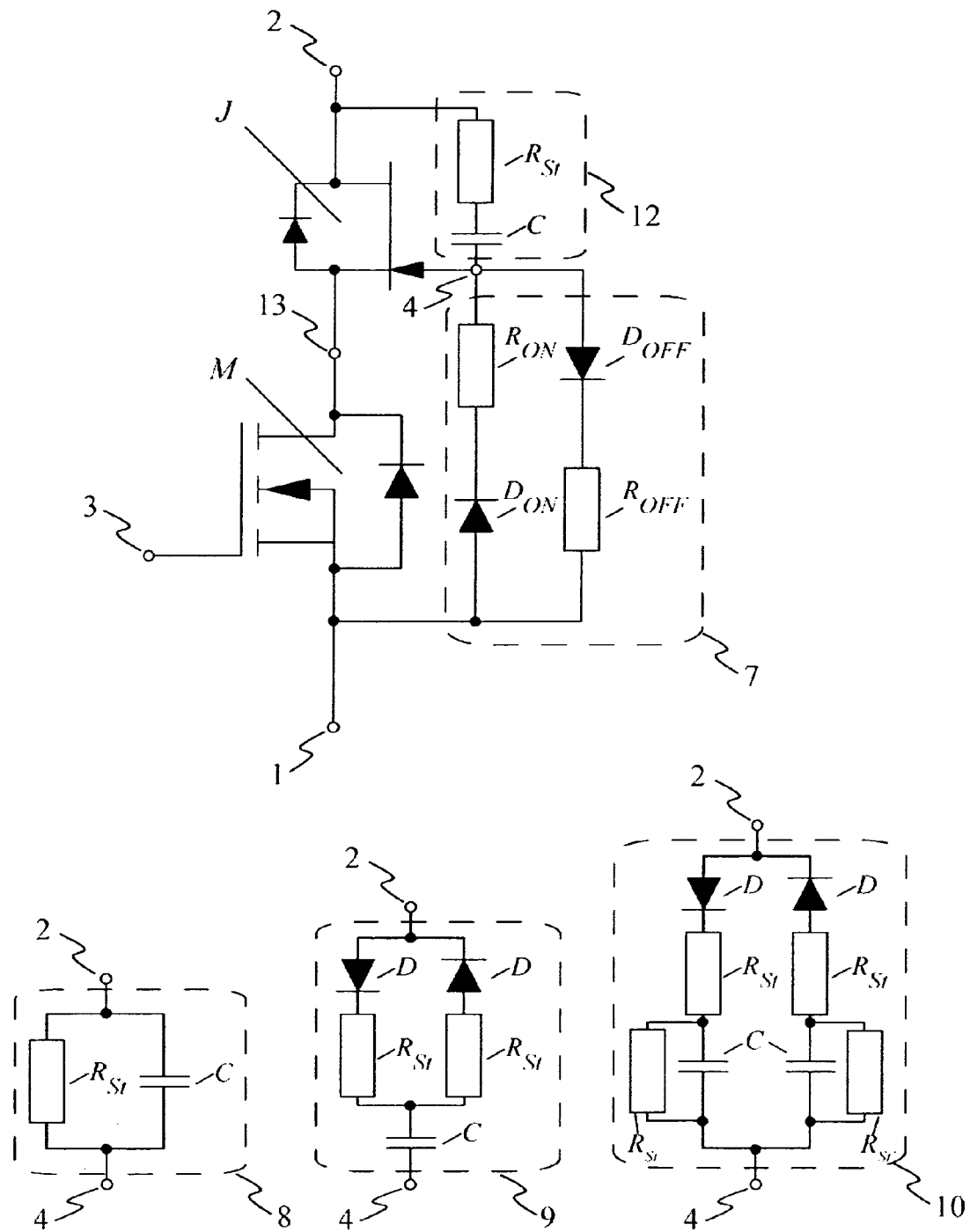
FIG. 5 a third embodiment of the invention, with different variants of a control circuit.

FIG. 5 shows a third embodiment of the invention, with different variants of a control circuit 8, 9, 10, 12 and with a further variant of the resistance arrangement 7. The shown variant of the resistance arrangement 7 comprises selection diodes $D_{ON}$, $D_{OFF}$, by way of which further additional resistances $R_{ON}$, $R_{OFF}$ with different resistance values may be selected according to the direction of the flow of current through the resistance arrangement 7. By way of this, the one further additional resistance $R_{ON}$ becomes effective when switching on, and the other additional resistance $R_{OFF}$ becomes effective when switching off. The further variants 8, 9, 10 of the control circuit are a second variant 8 with a parallel connection of the capacitance C and of the damping resistance $R_{St}$;

a third variant 9 with the capacitance C in series with two parallel damping resistances $R_{St}$ which may be selected in each case by anti-parallel diodes D according to the direction of the current (and which usefully have different resistance values);

a fourth variant 10 with two parallel branches which may be selected in each case by anti-parallel diodes D according to the direction of the current, wherein each of the branches comprises a damping resistance $R_{St}$ in series with a parallel connection of a capacitance C to a further damping resistance $R_{St}'$. With this, as also in the third variant, one may set the switching times and the steepnesses of the voltage changes separately for the switching-on and switching-off, wherein also the capacitances C may be selected separately for the switching-on and switching-off. The further damping resistances $R_{St}'$ also serve for the discharge of the capacitances C, since this here is not possible via the diodes in every case.

Figure 6:
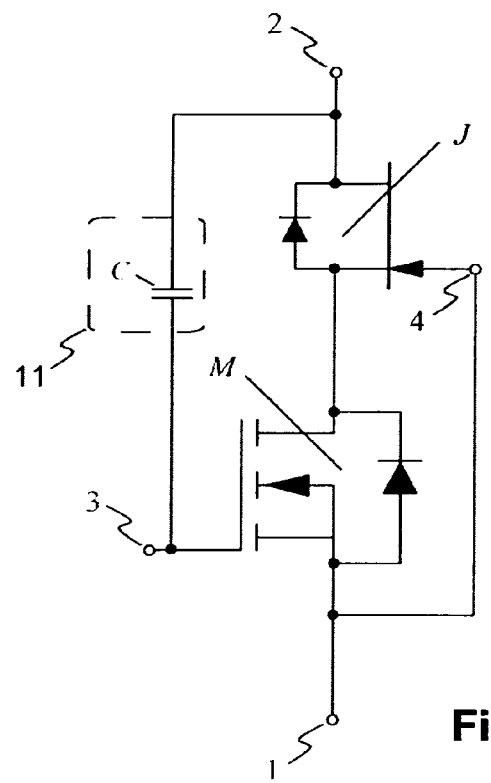
FIG. 6 a fourth embodiment of the invention.

FIG. 6 shows a fourth embodiment of the invention, in which the control circuit 11 is connected between the second terminal 2 and a first control input 3 of the first semiconductor switch, thus of the MOSFET M or IGFET, wherein this first control input 3 is equal to the gate terminal of the MOSFET M.

The output resistance of the circuit which produces the control signal at the control input 3, in this embodiment, with the control circuit 11 as also with the gate-source capacitance of the MOSFET M, in each case form an RC-element. These two occurring RC-elements permit the controlled influencing of the switching times of the cascode circuit in the following manner:

The output resistance increases the time constants of both RC-elements.

the RC-element with the parasitic capacitance of the MOSFET M influences the switching-on and switching-off behaviour of the MOSFET, wherein the parasitic capacitance is given by its construction. The larger the output resistance, the larger is the time constant of the charging or discharging procedure of the capacitor, according to the law τ=R·C. With the special arrangement of the cascode circuit, a larger series resistance effects a larger delay until the complete switching action sets in.

The RC-element with the control circuit 11 and the series resistance influences the switching speed of the cascode circuit after the switching procedure sets in. The RC-element may be optimised to the application of the switching device and the desired switching speed. The current which is required due to the negative feedback of the Miller capacitance is limited by the output resistance.

Figure 7:
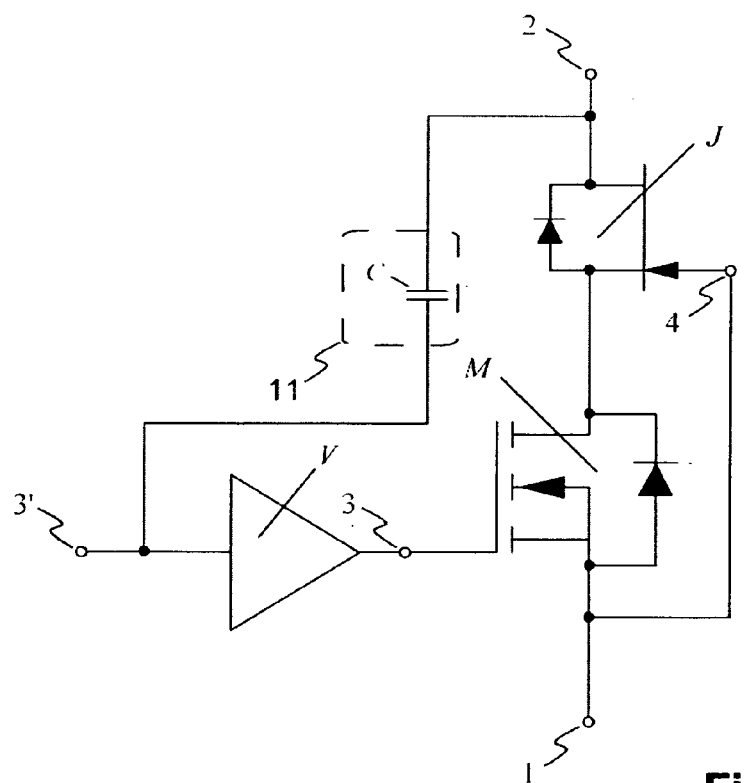
FIG. 7 a fifth embodiment of the invention.

FIG. 7 shows a fifth embodiment of the invention, in which the control switch 11 is connected between the second terminal 2 and a first control input 3' of the lower semiconductor switch, thus of the MOSFET M or the IGFET, wherein here the first control input 3' is connected to a non-inverting input 3' of a driver amplifier V for activating the gate terminal of the MOSFET M.

In the embodiment of FIGS. 6 and 7, the Miller effect likewise occurs due to feedback to the first control input and by way of this also the desired settable delay of the switching procedures of the cascode circuit. The control circuit 11 by way of example is drawn as an single capacitance C, but one may however also apply other variants 8, 9, 10 of the control circuit, as is shown for example in FIG. 5, in order to set the damping and in order to influence the switching-on and switching-off procedures independently of one another.

It is to be understood that in the present text, when one speaks of two elements being connected to one another, it is always in each case an electrical connection of the elements which is meant.

The invention claimed is:

1. A switching device for switching a current between a first terminal and a second terminal, comprising:

a cascode circuit with a series connection of a first semiconductor switch and a second semiconductor switch that are connected between the first terminal and the second terminal, wherein the two semiconductor switches are connected to one another via a common point, and the first semiconductor switch is activated by way of a first control input in accordance with a voltage between the first control input and the first terminal, and the second semiconductor switch is activated by way of a second control input in accordance with a voltage between the second control input and the common point, wherein a control circuit with a capacitance of a presettable size is connected between the second terminal and at least one of the control inputs, the connection between the capacitance of a presettable size and the second terminal being permanently made without a switch.

2. The switching device according to claim 1, wherein the control circuit is connected between the second terminal and the second control input.

3. The switching device according to claim 1, wherein the second control input is equal to a gate terminal or base terminal of the second semiconductor switch.

4. The switching device according to claim 1, wherein control circuit is connected between the second terminal and the first control input.

5. The switching device according to claim 4, wherein the first control input is the same as a gate terminal or base terminal of the first semiconductor switch.

6. The switching device according to claim 1, wherein the control circuit comprises a capacitance in series with a damping resistance.

7. A switching device for switching a current between a first terminal and a second terminal, comprising:

a cascode circuit with a series connection of a first semiconductor switch and a second semiconductor switch, wherein the two semiconductor switches are connected to one another via a common point, and the first semiconductor switch is activated by way of a first control input in accordance with a voltage between the first control input and the first terminal, and the second semiconductor switch is activated by way of a second control input in accordance with a voltage between the second control input and the common point, wherein a control circuit with a capacitance of a presettable size is connected between the second terminal and at least one of the control inputs, wherein the control circuit comprises two parallel branches with capacitances, and the two branches comprise antiparallel diodes, so current flows through the one of the two branches depending on the polarity of a voltage prevailing at the control circuit.

8. The switching device according to claim 1, wherein a resistance arrangement is arranged between the second control input and the first terminal.

9. The switching device according to claim 8, wherein the resistance arrangement has a single resistance as an additional resistance.

10. The switching device according to claim 8, wherein the resistance arrangement comprises a parallel connection in each case of a series connection of a selection diode to a further additional resistance, wherein the two diodes are connected antiparallel to one another.

11. The switching device according to claim 1, wherein the first semiconductor switch is an IGFET.

12. The switching device according to claim 1, wherein the second semiconductor switch is a JFET.

13. The switching device according to claim 1, wherein the control circuit and further elements of a circuitry network are parameterised such that when switching the control circuit between on and off states, a speed of the voltage change over the switching device is at least twice, five times to ten times lower in comparison to the switching device without a circuitry network.

14. The switching device according to claim 1, wherein the second control input is equal to a gate terminal or base terminal of the second control input or is connected via a presettable series resistance to the gate terminal or the base terminal of the second semiconductor switch.

15. The switching device according to claim 4, wherein the first control input is the same as a non-inverting input of a driver amplifier (V) for activating the gate terminal or the base terminal of the first semiconductor switch.

16. A switching device for switching a current between a first terminal and a second terminal, comprising:

a cascode circuit with a series connection of a first semiconductor switch and a second semiconductor switch, wherein the two semiconductor switches are connected to one another via a common point, and the first semiconductor switch is activated by way of a first control input in accordance with a voltage between the first control input and the first terminal, and the second semiconductor switch is activated by way of a second control input in accordance with a voltage between the second control input and the common point, wherein a control circuit with a capacitance of a presettable size is connected between the second terminal and at least one of the control inputs, wherein the control circuit comprises a capacitance parallel to a damping resistance.

17. The switching device according to claim 1, wherein the control circuit comprises two parallel branches with damping resistances, and the two branches comprise antiparallel diodes, so current flows through the one of the two branches depending on the polarity of a voltage prevailing at the control circuit.

18. The switching device according to claim 1, wherein the first semiconductor switch is a MOSFET.

* * * * *